United States Patent
Wei et al.

(10) Patent No.: US 9,012,946 B2
(45) Date of Patent: *Apr. 21, 2015

(54) LIGHT EMITTING DIODE

(71) Applicants: Tsinghua University, Beijing (CN); Hon Hai Precision Industry Co., Ltd., New Taipei (TW)

(72) Inventors: Yang Wei, Beijing (CN); Shou-Shan Fan, Beijing (CN)

(73) Assignees: Tsinghua University, Beijing (CN); Hon Hai Precision Industry Co., Ltd., New Taipei (TW)

(*) Notice: Subject to any disclaimer, the term of this patent is extended or adjusted under 35 U.S.C. 154(b) by 0 days.

This patent is subject to a terminal disclaimer.

(21) Appl. No.: 14/449,104

(22) Filed: Jul. 31, 2014

(65) Prior Publication Data

US 2014/0339592 A1 Nov. 20, 2014

Related U.S. Application Data

(63) Continuation of application No. 13/288,327, filed on Nov. 3, 2011, now Pat. No. 8,841,686.

(30) Foreign Application Priority Data

Apr. 29, 2011 (CN) .......................... 2011 1 1107515

(51) Int. Cl.
| | |
|---|---|
| H01L 21/00 | (2006.01) |
| H01L 33/44 | (2010.01) |
| H01L 21/02 | (2006.01) |
| H01L 33/12 | (2010.01) |
| B82Y 20/00 | (2011.01) |

(52) U.S. Cl.
CPC ............ *H01L 33/44* (2013.01); *H01L 21/0237* (2013.01); *H01L 21/02521* (2013.01); *H01L 21/02576* (2013.01); *H01L 21/02639* (2013.01); *H01L 21/02642* (2013.01); *H01L 33/12* (2013.01); *H01L 2924/0002* (2013.01); *B82Y 20/00* (2013.01); *Y10S 977/742* (2013.01); *Y10S 977/95* (2013.01)

(58) Field of Classification Search
USPC ................................................ 257/98–99, 13
See application file for complete search history.

(56) References Cited

U.S. PATENT DOCUMENTS

| | | | | |
|---|---|---|---|---|
| 7,563,711 B1 * | 7/2009 | Ward et al. | ..................... | 438/669 |
| 8,021,902 B2 * | 9/2011 | Li et al. | ........................... | 438/22 |
| 8,044,388 B2 * | 10/2011 | Ward et al. | ...................... | 257/40 |
| 8,168,965 B2 * | 5/2012 | Rinzler et al. | ................... | 257/12 |
| 8,435,818 B2 * | 5/2013 | Wei et al. | ........................ | 438/42 |
| 8,440,485 B2 * | 5/2013 | Wei et al. | ........................ | 438/42 |
| 8,476,094 B2 * | 7/2013 | Wei et al. | ........................ | 438/42 |
| 8,551,807 B2 * | 10/2013 | Wei et al. | ........................ | 438/99 |
| 8,564,009 B2 * | 10/2013 | Min et al. | ........................ | 257/99 |
| 8,569,081 B2 * | 10/2013 | Wei et al. | ........................ | 438/22 |

(Continued)

*Primary Examiner* — Laura Menz

(74) *Attorney, Agent, or Firm* — Novak Druce Connolly Bove + Quigg LLP

(57) ABSTRACT

A light emitting diode includes a patterned carbon nanotube layer, a first semiconductor layer, a second semiconductor layer, an active layer stacked on an epitaxial growth surface of a substrate in that sequence. A first portion of the patterned carbon nanotube layer is covered by the first semiconductor layer and a second portion of the patterned carbon nanotube layer is exposed. A first electrode is electrically connected with the second semiconductor layer. A second electrode electrically is electrically connected with the second portion of the patterned carbon nanotube layer.

17 Claims, 15 Drawing Sheets

(56) References Cited

U.S. PATENT DOCUMENTS

| | | | |
|---|---|---|---|
| 8,569,736 B2* | 10/2013 | Wei et al. | 257/13 |
| 8,633,467 B2* | 1/2014 | Wei et al. | 257/13 |
| 2004/0036990 A1* | 2/2004 | Hanano | 359/831 |
| 2005/0199894 A1* | 9/2005 | Rinzler et al. | 257/94 |
| 2008/0142812 A1* | 6/2008 | Chang et al. | 257/77 |
| 2008/0142813 A1* | 6/2008 | Chang et al. | 257/77 |
| 2009/0173964 A1* | 7/2009 | Ward et al. | 257/103 |
| 2010/0133569 A1* | 6/2010 | Li et al. | 257/98 |
| 2010/0148183 A1* | 6/2010 | Ward et al. | 257/76 |
| 2010/0221852 A1* | 9/2010 | Li et al. | 438/22 |
| 2012/0175662 A1* | 7/2012 | Min et al. | 257/99 |
| 2012/0273754 A1* | 11/2012 | Wei et al. | 257/13 |
| 2012/0273755 A1* | 11/2012 | Wei et al. | 257/13 |
| 2012/0273818 A1* | 11/2012 | Wei et al. | 257/98 |
| 2012/0273827 A1* | 11/2012 | Wei et al. | 257/99 |
| 2012/0276666 A1* | 11/2012 | Wei et al. | 438/22 |
| 2012/0276669 A1* | 11/2012 | Wei et al. | 438/29 |
| 2012/0276670 A1* | 11/2012 | Wei et al. | 438/42 |
| 2012/0276671 A1* | 11/2012 | Wei et al. | 438/42 |
| 2012/0276673 A1* | 11/2012 | Wei et al. | 438/42 |
| 2013/0224893 A1* | 8/2013 | Wei et al. | 438/29 |
| 2013/0260487 A1* | 10/2013 | Wei et al. | 438/22 |
| 2014/0014901 A1* | 1/2014 | Wei et al. | 257/13 |
| 2014/0017836 A1* | 1/2014 | Wei et al. | 438/32 |
| 2014/0065742 A1* | 3/2014 | Wei et al. | 438/29 |

* cited by examiner

LIGHT EMITTING DIODE

CROSS-REFERENCE TO RELATED APPLICATIONS

This application is a continuation of U.S. patent application Ser. No. 13/288,327, filed on Nov. 3, 2011, entitled, "LIGHT EMITTING DIODE," which claims all benefits accruing under 35 U.S.C. §119 from China Patent Application 201110110751.5, filed on Apr. 29, 2011 in the China Intellectual Property Office, the disclosure of which is incorporated herein by reference. The disclosures of the above-identified applications are incorporated herein by reference.

BACKGROUND

1. Technical Field

The present disclosure relates to a light emitting diode (LED) and a method for making the same.

2. Description of the Related Art

LEDs are semiconductors that convert electrical energy into light. Compared to conventional light sources, the LEDs have higher energy conversion efficiency, higher radiance (i.e., they emit a larger quantity of light per unit area), longer lifetime, higher response speed, and better reliability. At the same time, LEDs generate less heat. Therefore, LED modules are widely used as light sources in optical imaging systems, such as displays, projectors, and so on.

A conventional LED commonly includes an N-type semiconductor layer, a P-type semiconductor layer, an active layer, an N-type electrode, and a P-type electrode. The active layer is located between the N-type semiconductor layer and the P-type semiconductor layer. The P-type electrode is located on the P-type semiconductor layer. The N-type electrode is located on the N-type semiconductor layer. Typically, the P-type electrode is transparent. In operation, a positive voltage and a negative voltage are applied respectively to the P-type semiconductor layer and the N-type semiconductor layer. Thus, holes in the P-type semiconductor layer and electrons in the N-type semiconductor layer can enter the active layer and combine with each other to emit visible light.

However, extraction efficiency of LEDs is low because typical semiconductor materials have a higher refraction index than that of air. Large-angle light emitted from the active layer may be internally reflected in LEDs, so that a large portion of the light emitted from the active layer will remain in the LEDs, thereby degrading the extraction efficiency.

What is needed, therefore, is a light emitting diode and a method for making the same, which can overcome the above-described shortcomings.

BRIEF DESCRIPTION OF THE DRAWINGS

Many aspects of the embodiments can be better understood with reference to the following drawings. The components in the drawings are not necessarily drawn to scale, the emphasis instead being placed upon clearly illustrating the principles of the embodiments. Moreover, in the drawings, like reference numerals designate corresponding parts throughout the several views.

DETAILED DESCRIPTION

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean at least one.

Figure 1:
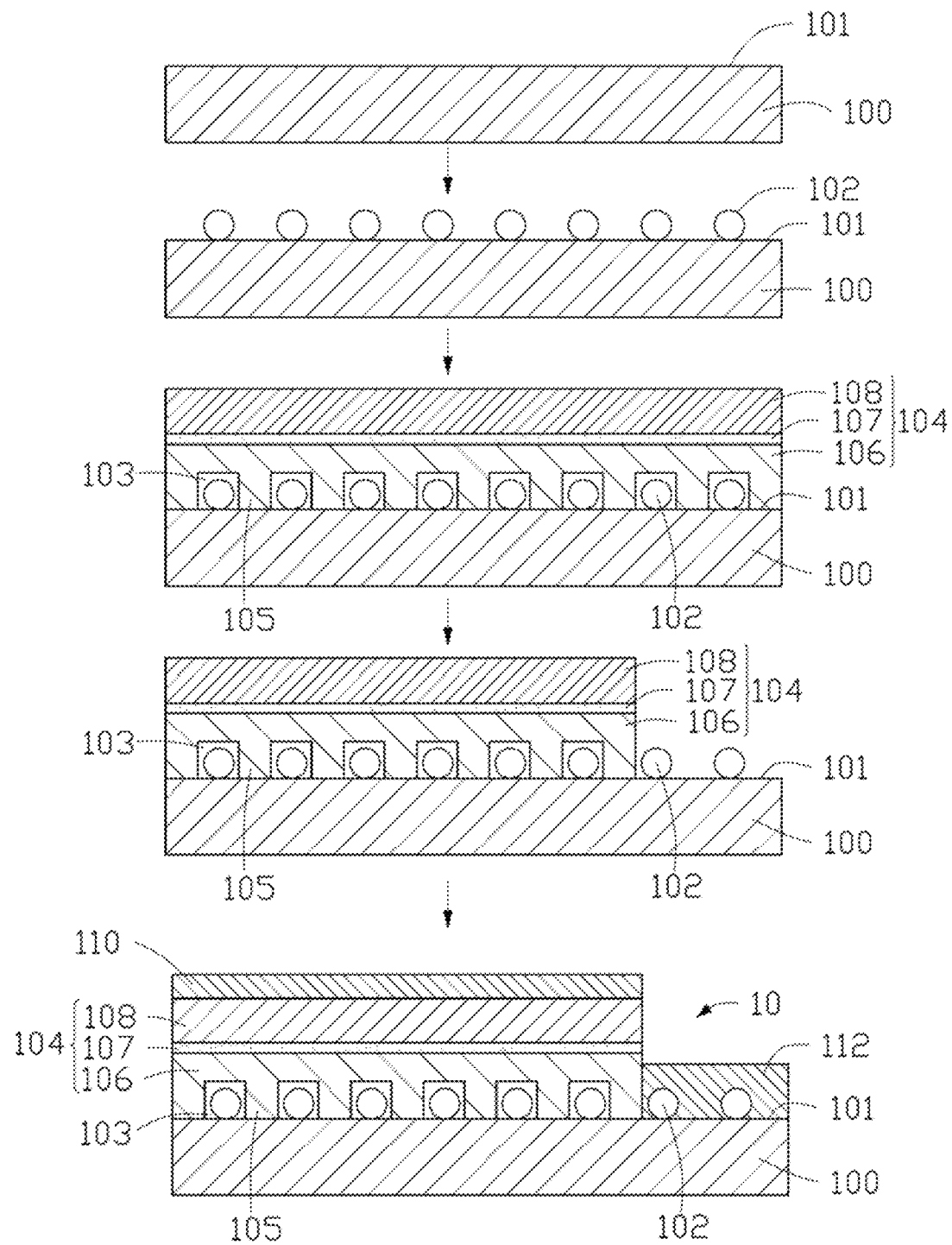
FIG. 1 is a flowchart of one embodiment a method for manufacturing a LED.

Referring to FIG. 1, a method for manufacturing a light emitting diode (LED) 10 includes the following steps:

(S10) providing a substrate 100 having an epitaxial growth surface 101;

(S20) applying a carbon nanotube layer 102 on the epitaxial growth surface 101;

(S30) growing a semiconductor epitaxial layer 104 on the epitaxial growth surface 101, wherein the semiconductor epitaxial layer 104 includes an N-type semiconductor layer 106, an active layer 107 and a P-type semiconductor layer 108;

(S40) exposing a part of the carbon nanotube layer 102 by etching the semiconductor epitaxial layer 104; and (S50) applying a first electrode 110 on the semi-conductor layer 104 and a second electrode 112 on the carbon nanotube layer 102, wherein the first electrode 110 is deposited on a surface of the semiconductor layer 104, and the second electrode 112 is deposited on the exposed part of the carbon nanotube layer 102 at the epitaxial growth surface 101.

In step (S10), the epitaxial growth surface 101 is used to grow the semiconductor epitaxial layer 104. The epitaxial growth surface 101 is a very smooth surface. Oxygen and carbon are removed from the surface. The substrate 100 can be a single layer structure or a multiple layer structure. If the substrate 100 is a single layer structure, the substrate 100 can be a single-crystal structure. The single-crystal structure includes a crystal face which is used as the epitaxial growth surface 101. The material of the substrate 100 can be SOI (Silicon on insulator), $LiGaO_2$, $LiAlO_2$, $Al_2O_3$, Si, GaAs, GaN, GaSb, InN, InP, InAs, InSb, AlP, AlAs, AlSb, AlN, GaP, SiC, SiGe, GaMnAs, GaAlAs, GaInAs, GaAlN, GaInN, AlInN, GaAsP, InGaN, AlGaInN, AlGaInP, GaP:Zn or GaP:N. The material of the substrate 100 is not limited, as long as the substrate 100 has an epitaxial growth surface 101 on which N-type semiconductor layer 106 can grow. If the substrate 100 is a multiple layer structure, the substrate 100 should include at least one layer of the single-crystal structure mentioned previously. The material of the substrate 100 can be selected according to N-type semiconductor layer 106. In one embodiment, the lattice constant and thermal expansion coefficient of the substrate 100 is similar to N-type semiconductor layer 106 thereof in order to improve the quality of N-type semiconductor layer 106. In another embodiment, the material of the substrate 100 is sapphire. The thickness, shape, and size of the substrate 100 are arbitrary and can be selected according to need.

In step (S20), the thickness of the carbon nanotube layer 102 ranges from about 1 nanometer to about 100 micrometers, such as 10 nanometers, 200 nanometers, or 1 micrometer. The carbon nanotube layer 102 is a patterned structure. In one embodiment, the carbon nanotube layer 102 is about 100 nanometers in thickness. The carbon nanotubes of the carbon nanotube layer 102 can be single-walled carbon nanotubes, double-walled carbon nanotubes, or multi-walled carbon nanotubes. The length and diameter of the carbon nanotubes can be selected according to need. Because the carbon nanotube layer 102 is a patterned structure, when the carbon nanotube layer 102 is applied on the epitaxial surface 101, some portions of the epitaxial surface 101 will be exposed to grow N-type semiconductor layer 106. Thus the carbon nanotube layer 102 is used as a mask layer.

The term "patterned structure" means that the carbon nanotube layer 102 defines a plurality of apertures 105 penetrating the carbon nanotube layer 102 perpendicular to the surface of the carbon nanotube layer 102. The apertures 105 can be micro-holes formed by the adjacent carbon nanotubes. The apertures 105 can also be gaps formed by the adjacent carbon nanotubes aligned parallel with each other along the axial direction of the carbon nanotubes. If the apertures 105 are micro-holes, the diameter of the micro-hole range from about 10 nanometers to about 500 micrometers. If the apertures 105 are gaps, the average width of the gap ranges from about 10 nanometers to about 500 nanometers. The carbon nanotube layer 102 can have both micro-holes and gaps at the same time. The diameter of the micro-hole and the width of the gap can be different. In one embodiment, the apertures 105 uniformly distribute in the carbon nanotube layer 102.

Both the diameter of the micro-hole and the width of the gap are defined as "the size of the apertures" in the following description. The size of the apertures 105 range from about 10 nanometers to about 500 micrometers, such as 1 micrometer, 10 micrometer 80 micrometers, or 120 micrometers. The smaller the size of the apertures 105, the fewer dislocations exist in the process of growing the epitaxial layer, and the higher the quality of N-type semiconductor layer 106. In one embodiment, the size of the apertures 105 range from about 10 nanometers to about 10 micrometers. Furthermore, the duty cycle of the carbon nanotube layer 102 ranges from about 1:100 to about 100:1 such as 1:10, 1:2, 1:4, 4:1, 2:1, or 10:1. "Duty cycle" is defined as the area ratio between the epitaxial growth surface 101 which is covered by carbon nanotubes and the exposed surface which is exposed via the apertures 105. In one embodiment, the duty cycle of the carbon nanotube layer 102 ranges from about 1:4 to about 4:1.

The alignment of the carbon nanotubes in the carbon nanotube layer 102 can be disorderly or orderly aligned to ensure that the carbon nanotube layer 102 has the plurality of apertures 105. The disordered carbon nanotubes can be randomly aligned. The disordered carbon nanotubes can also be entangled with each other. The ordered carbon nanotubes can be arranged approximately along a same direction or have two or more sections having carbon nanotubes within the section arranged approximately along a same direction (different sections can have different directions). The plurality of carbon nanotubes can be aligned along a crystal orientation of the substrate 100 or aligned at a certain angle with respect to the crystal orientation. In one embodiment, the plurality of carbon nanotubes in the carbon nanotube layer 102 is aligned parallel to the surface of the carbon nanotube layer 102. If the carbon nanotube layer 102 is applied on the substrate 100, the plurality of carbon nanotubes are aligned parallel to the epitaxial growth surface 101.

The carbon nanotube layer 102 can directly grow on the epitaxial growth surface 101 by a chemical vapor deposition (CVD) method. The carbon nanotube layer 102 can also be fabricated by growing the carbon nanotube array on another substrate and transferred to the epitaxial growth surface 101. In one embodiment, the carbon nanotube layer 102 is a free-standing structure, and the carbon nanotube layer 102 can be conveniently and directly placed on the substrate 100. The term "free-standing structure" means that the carbon nanotube layer 102 can sustain the weight of itself when it is hoisted by a portion thereof without any significant damage to its structural integrity. So, if the carbon nanotube layer 102 is placed between two separate supports, a portion of the first carbon nanotube structure which does not in contact with the two supports would be suspended between the two supports and maintain structural integrity. The carbon nanotube layer 102 includes a plurality of carbon nanotubes distributed uniformly and attracted by van der Waals attractive force therebetween. The substrate 100 and the carbon nanotube layer 102 can form a new substrate growing a N-type semiconductor layer 106.

The carbon nanotube layer 102 can be a continuous and integrated structure. The carbon nanotube layer 102 can also be a single layer structure including a plurality of carbon nanotube wires. The plurality of carbon nanotube wires can be parallel with each other. In this situation, the plurality of carbon nanotube wires can form a free-standing structure by applying a support surface to each of the carbon nanotube wires. Furthermore, the carbon nanotubes can be joined end to end by van der Waals force along the aligned direction of the carbon nanotubes, and adjacent carbon nanotubes parallel with each other can also be joined by van der Waals force, thus the free-standing character will be improved.

The carbon nanotube layer 102 can be a pure carbon nanotube structure composed only of a plurality of carbon nanotubes. The carbon nanotube layer 102 is not functionalized or treated with acid. The carbon nanotube layer 102 can also be a composite structure composed of carbon nanotubes and additive material. The carbon nanotubes are used as the main component and provide some framework. The additive materials include graphite, graphene, silicon carbide, boron nitride, silicon nitride, silicon dioxide, amorphous carbon, metal carbides, metal oxides, and metal nitrides. The additive materials can be partially coated on the surface the carbon nanotubes. In one embodiment, the additive material is coated on the surface of the carbon nanotubes. Thus the size of the apertures 105 is reduced. The additive materials can be coated on the carbon nanotubes by CVD, physical vapor deposition (PVD), or sputtering methods.

The carbon nanotube layer 102 can be preformed and then placed directly placed on the epitaxial growth surface 101. In one embodiment, the carbon nanotube layer 102 can also be treated with an organic solvent after the carbon nanotube layer 102 is attached on the epitaxial growth surface 101. The carbon nanotube layer 102 can be treated by dripping the organic solvent onto the carbon nanotube layer 102 or putting the carbon nanotube layer 102 into the organic solvent to soak the entire surfaces of the carbon nanotube layer 102. During the surface treatment, the carbon nanotube layer 102 is attached firmly on the epitaxial growth surface 101 due to factors such as surface tension. The organic solvents can be ethanol, methanol, acetone, dichloroethane, or chloroform. In one embodiment, the organic solvent is ethanol.

The carbon nanotube layer 102 can include at least one carbon nanotube film or a plurality of carbon nanotube wires. If the carbon nanotube layer 102 includes a plurality of carbon nanotube films, the carbon nanotube films are stacked together. In one embodiment, the carbon nanotube layer 102 includes about 2 layers to about 100 layers of carbon nanotube film. If the carbon nanotube layer 102 includes a plurality of carbon nanotube wires, the carbon nanotube wires can be aligned parallel to each other at a certain interval. The distance between adjacent carbon nanotube wires ranges about 0.1 micrometer to about 200 micrometers. In one embodiment, the distance ranges from about 10 micrometers to about 100 micrometers. The gaps between the adjacent carbon nanotube wires form the apertures 105 of the carbon nanotube layer 102. In one embodiment, the carbon nanotube wires can also form a cross-network structure. Thus the size of the apertures 105 can be controlled by the layers of carbon nanotube film or the distance between the adjacent carbon nanotube wires.

In one embodiment, the carbon nanotube film can be a drawn carbon nanotube film which is a freestanding structure composed of a plurality of carbon nanotubes. The carbon nanotubes are arranged substantially parallel to a surface of the drawn carbon nanotube film. A large majority of the carbon nanotubes in the drawn carbon nanotube film can be oriented along a preferred orientation, meaning that a majority of the carbon nanotubes in the carbon nanotube film are arranged substantially along the same direction. An end of one carbon nanotube is joined to another end of an adjacent carbon nanotube arranged substantially along the same direction by the van der Waals force.

Some variations can occur in the orientation of the carbon nanotubes in the drawn carbon nanotube film. Microscopically, the carbon nanotubes oriented substantially along the same direction may not be perfectly aligned in a straight line, and some curved portions may exist. Contact between some carbon nanotubes placed substantially side by side and oriented along the same direction cannot be totally excluded.

Figure 2:
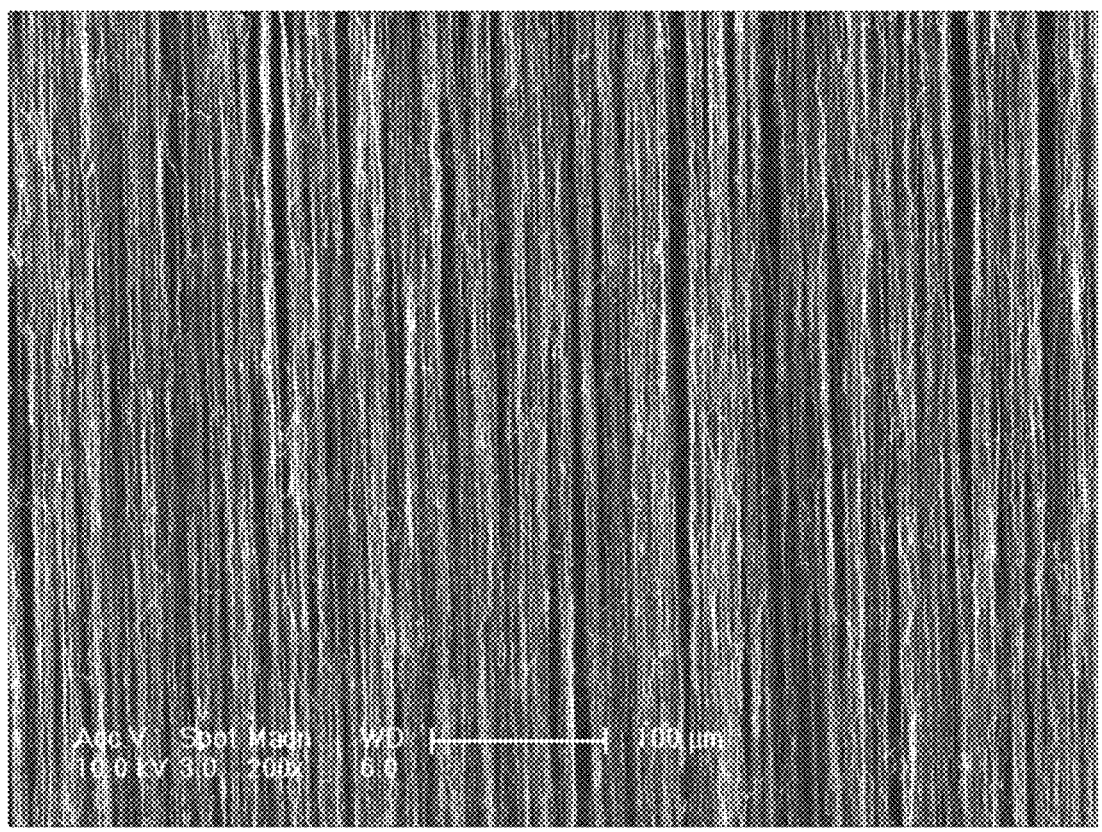
FIG. 2 shows a Scanning Electron Microscope (SEM) image of one embodiment of a drawn carbon nanotube film.
Figure 3:
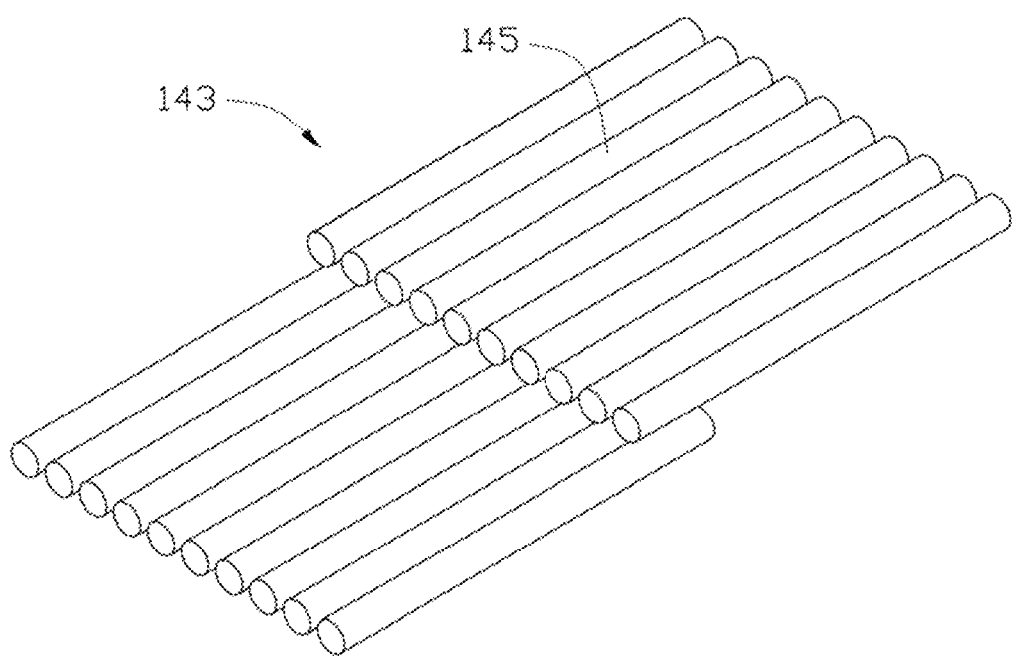
FIG. 3 shows a schematic view of one embodiment of a carbon nanotube segment of a drawn carbon nanotube film.

Referring to FIG. 2 and FIG. 3, the drawn carbon nanotube film can include a plurality of successively oriented carbon nanotube segments 143 joined end-to-end by the van der Waals force therebetween. Each carbon nanotube segment 143 includes a plurality of carbon nanotubes 145 substantially parallel to each other, a joined by the van der Waals force therebetween, and oriented substantially along the same direction. The drawn carbon nanotube film can be drawn from a carbon nanotube array. The carbon nanotube segments 143 can vary in width, thickness, uniformity, and shape. The carbon nanotubes 145 in the drawn carbon nanotube film are also substantially oriented along a preferred orientation. A thickness of the carbon nanotube film can range from about 1 nanometer to about 100 micrometers. In one embodiment, the thickness of the carbon nanotube film ranges from about 100 nanometers to about 10 micrometers. A width of the carbon nanotube film relates to the carbon nanotube array from which the drawn carbon nanotube film is drawn. In each carbon nanotube segment 143, a plurality of micro-holes or gaps exists between adjacent carbon nanotubes. These micro-holes or gaps form the apertures 105. The size of the apertures 105 is smaller than 10 micrometers. Examples of a carbon nanotube film are taught by U.S. Pat. No. 7,045,108 to Jiang et al., and WO 2007015710 to Zhang et al.

Figure 4:
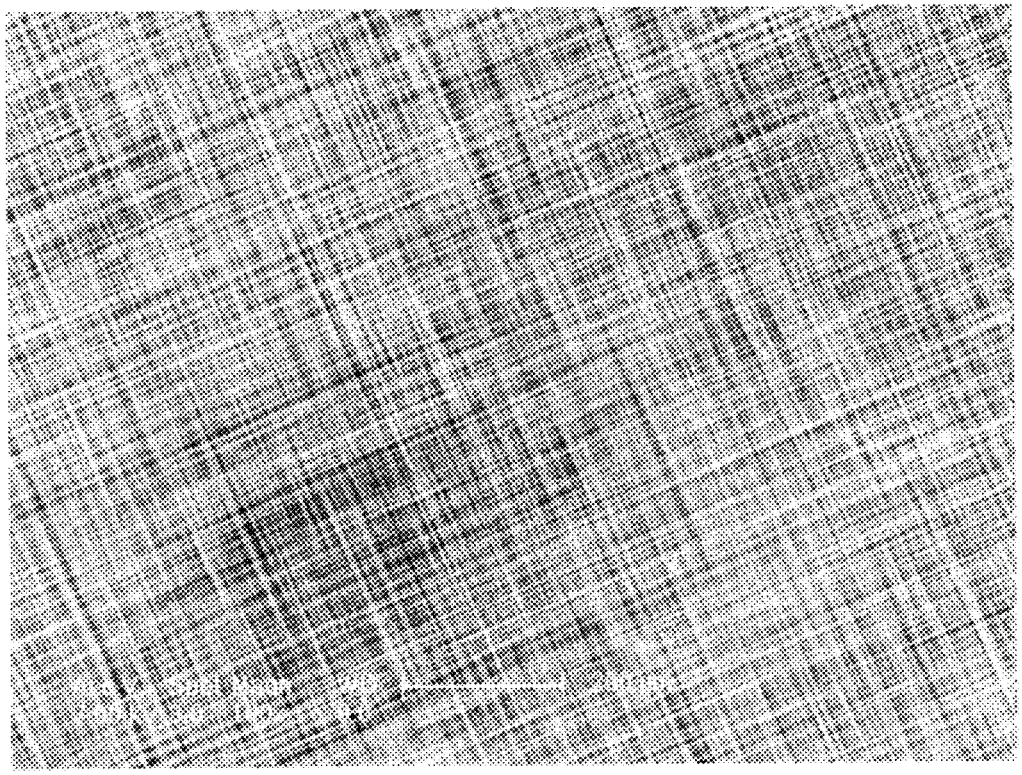
FIG. 4 shows a SEM image of one embodiment of a plurality of carbon nanotube films which are stacked in a crossed manner.

Referring to FIG. 4, in one embodiment, the carbon nanotube layer 102 includes at least two carbon nanotube films stacked with each other. An angle between the aligned directions of the carbon nanotubes in the two adjacent carbon nanotube films can range from about 0 degrees to about 90 degrees ($0° \leq \alpha \leq 90°$).

The carbon nanotube film can be heated to reduce the thickness of the carbon nanotube film. The carbon nanotube film can be heated part by part to avoid destroying the carbon nanotube film. The heat treatment can include the following steps:

(S201) oxidizing some carbon nanotubes on a part of the carbon nanotube film by providing a heating device and heating the part of the carbon nanotube film with the heating device; and (S202) heating the carbon nanotube film part by part by moving the device.

Specifically, the carbon nanotube film can be divided into several parts and heated part by part. The carbon nanotube can be heated by a laser or microwaves. In one embodiment, the carbon nanotube film is irradiated by a laser device. Irradiated larger diameter carbon nanotubes will be removed, thereby reducing the thickness of the carbon nanotube film.

It is to be understood that the ways of laser irradiating are arbitrary. The movement of the laser device can be substantially parallel or perpendicular to the aligned direction of the carbon nanotubes. Using a laser device with a stable power density, the slower the moving speed of the laser device, the more carbon nanotubes of the carbon nanotube film will be destroyed, and the thinner the carbon nanotube film. However, if the speed is too slow, the carbon nanotube film will be completely destroyed. In one embodiment, a power density of the laser is greater than $0.053 \times 10^{12}$ W/m$^2$, a diameter of the irradiating pattern of the laser ranges from about 1 micrometer to about 5 millimeters, and a time of laser irradiation is less than 1.8 s. In one embodiment, the laser is a carbon dioxide laser, the power of the laser is about 30 W, a wavelength of the laser is about 10.6 microns, the diameter of the irradiating pattern of the laser is about 3 millimeters, and a moving speed of the laser device is less than 10 m/s.

Figure 5:
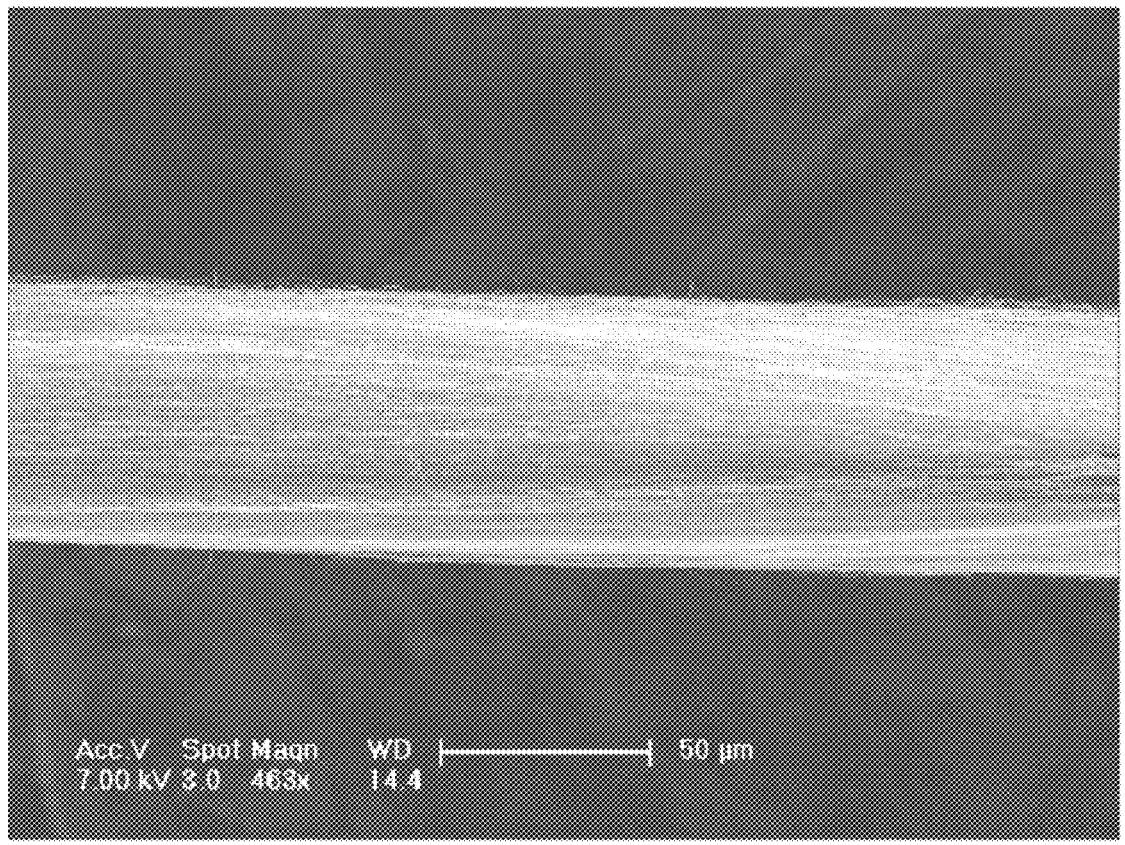
FIG. 5 shows a SEM image of one embodiment of an untwisted carbon nanotube wire.

The carbon nanotube wire includes untwisted carbon nanotube wire and twisted carbon nanotube wire. Referring to FIG. 5, the untwisted carbon nanotube wire includes a number of carbon nanotubes substantially parallel to each other. The untwisted carbon nanotube wire can be formed by treating the drawn carbon nanotube film with an organic solvent. The drawn carbon nanotube film is treated by applying the organic solvent to the carbon nanotube film to soak the surface of the drawn carbon nanotube film without adhering on the substrate. After being soaked by the organic solvent, the adjacent paralleled carbon nanotubes in the drawn carbon nanotube film will bundle together, due to the surface tension of the organic solvent as the organic solvent volatilizes, and thus, the drawn carbon nanotube film will shrink into untwisted carbon nanotube wire. Examples of the untwisted carbon nanotube wire are taught by U.S. Pat. No. 7,045,108 to Fan et al. and US publication No. 20070166223 A1 to Fan et al.

Figure 6:
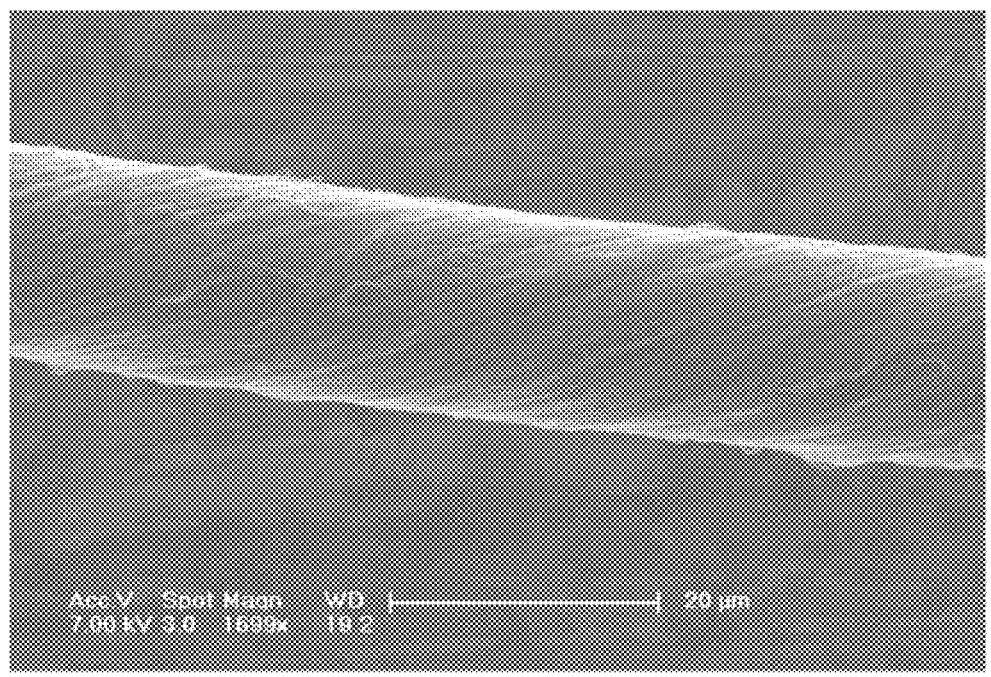
FIG. 6 shows a SEM image of one embodiment of a twisted carbon nanotube wire.

Referring to FIG. 6, the twisted carbon nanotube wire can be formed by twisting a drawn carbon nanotube film by using a mechanical force to turn the two ends of the drawn carbon nanotube film in opposite directions. The twisted carbon nanotube wire can be treated by applying the organic solvent thereon to bundle together adjacent paralleled carbon nanotubes in the twisted carbon nanotube film. The treated twisted carbon nanotube wire may have less specific surface area, and greater density and strength than a non-treated twisted carbon nanotube wire.

As discussed above, the carbon nanotube layer 102 can be used as a mask for growing the semiconductor epitaxial layer 104. The term 'mask for growing the semiconductor epitaxial layer 104' means that the carbon nanotube layer 102 can be used to shelter a part of the epitaxial growth surface 101 and expose the other part of the epitaxial growth surface 101. Thus, the semiconductor epitaxial layer 104 can grow from the exposed epitaxial growth surface 101. The carbon nanotube layer 102 can form a patterned mask on the epitaxial growth surface 101 because the carbon nanotube layer 102 defines a plurality of first apertures 105. Compared to lithography or etching, the method of forming a carbon nanotube layer 102 with masking is simple, low in cost, and will not pollute the substrate 100. If the carbon nanotube layer 102 is placed on the epitaxial growth surface 101, the carbon nanotubes of the carbon nanotube layer 102 will be substantially parallel to the epitaxial growth surface 101.

A buffer layer and an intrinsic layer (not shown) can be deposited on the epitaxial growth surface 101 before the step (S20). The quality of the semiconductor epitaxial layer 104 can be improved through this step.

In step (S30), the semiconductor epitaxial layer 104 grows via a process of molecular beam epitaxy (MBE), chemical beam epitaxy (CBE), vacuum epitaxy, low temperature epitaxy, choose epitaxy, liquid phase deposition epitaxy (LPE), metal organic vapor phase epitaxy (MOVPE), ultra-high vacuum chemical vapor deposition (UHVCVD), hydride vapor phase epitaxy (HYPE), and metal organic chemical vapor deposition (MOCVD). The semiconductor epitaxial layer 104 is a layer of single crystal structure growing on the epitaxial growth surface 101. The material of the semiconductor epitaxial layer 104 can be the same as the substrate 100. If the material is the same, the semiconductor epitaxial layer 104 is the homoepitaxial layer, otherwise the semiconductor epitaxial layer 104 is the heteroepitaxial layer. The thickness of the semiconductor epitaxial layer 104 can be selected according to need. In one embodiment, the semiconductor epitaxial layer 104 has a thickness ranging from about 100 nanometers to about 500 micrometers, such as about, 500 nanometers, 1 micrometer, 2 micrometers, 5 micrometers, 10 micrometers, and 50 micrometers. The material of the semiconductor epitaxial layer 104 can be Si, GaAs, GaN, GaSb, InN, InP, InAs, InSb, AlP, AlAs, AlSb, AlN, GaP, SiC, SiGe, GaMnAs, GaAlAs, GaInAs, GaAlN, GaInN, AlInN, GaAsP, InGaN, AlGaInN, AlGaInP, GaP:Zn, or GaP:N.

The N-type semiconductor layer 106 and the P-type semiconductor layer 108 are a doped semiconductor epitaxial layer. The active layer 107 is a photon excitation layer and can be one of a single layer quantum well film or multilayer quantum well films. The N-type semiconductor layer 106, the active layer 107, and the P-type semiconductor layer 108 are stacked on the epitaxial growth surface 101, and the active layer 107 is sandwiched between the N-type semiconductor layer 106 and the P-type semiconductor layer 108. The P-type semiconductor layer 108 can firstly grow on the substrate 100, and the active layer 107, the N-type semiconductor layer 106 can grow on the P-type semiconductor layer 108. In one embodiment, the material of the N-type semiconductor layer 106, the active layer 107, and the P-type semiconductor layer 108 is the same, thus defects caused by dislocation during the growth process will be reduced.

Figure 7:
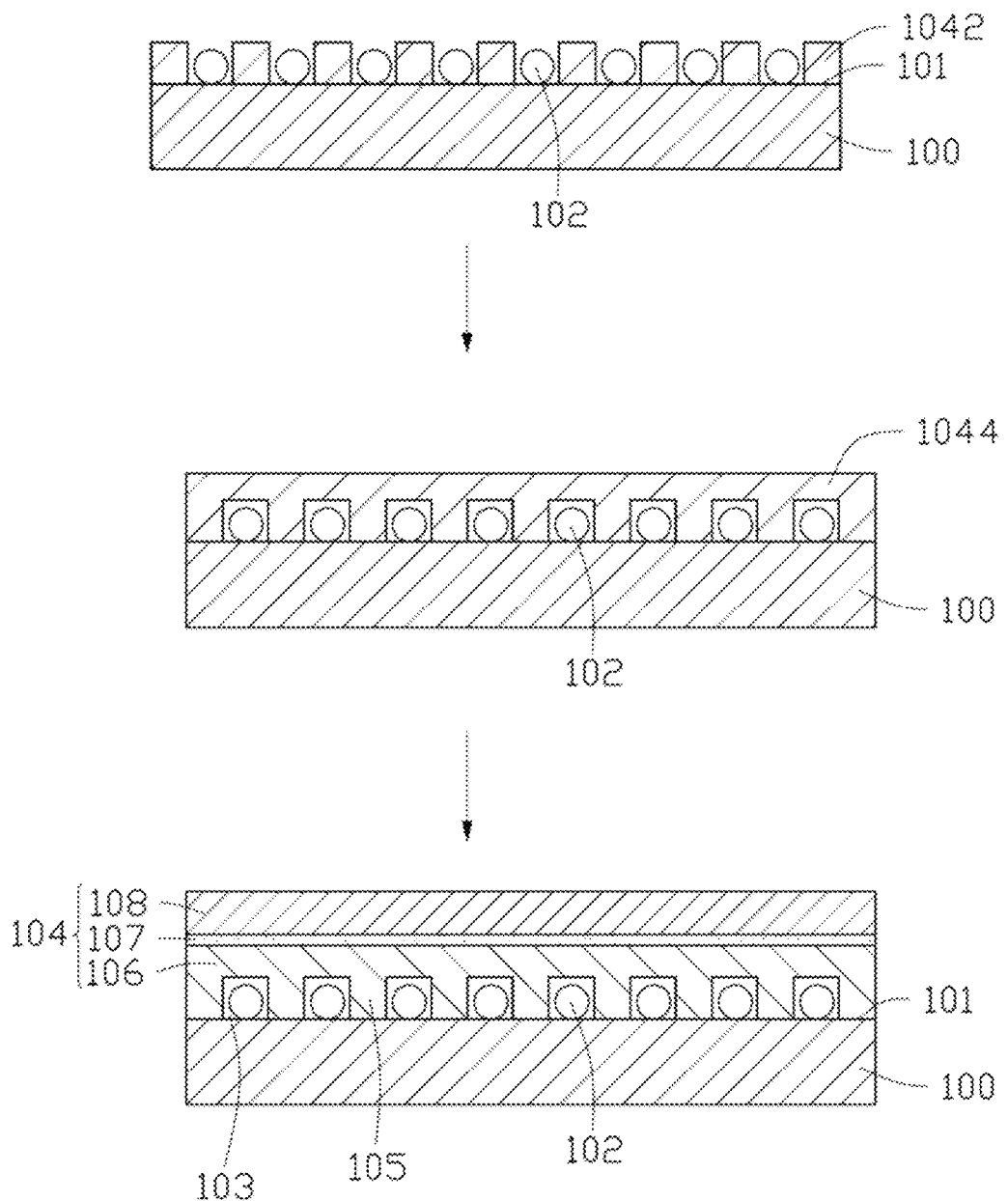
FIG. 7 shows a schematic view of growing an epitaxial layer.

In one embodiment, the semiconductor epitaxial layer 104 is doped via introducing different doped gas into the source gas. The N-type semiconductor layer 106, the active layer 107 and the P-type semiconductor layer 108 can grow in series by changing the doped gas and controlling the grow time. Referring to FIG. 7, the growth of the semiconductor epitaxial layer 104 can include the following steps:

(S31) growing a plurality of epitaxial crystal nucleus on the epitaxial growth surface 101, and forming from the epitaxial crystal nucleus a plurality of epitaxial crystal grains 1042 along the direction substantially perpendicular to the epitaxial growth surface 101;

(S32) growing from the plurality of epitaxial crystal grains 1042 a continuous epitaxial film 1044 along the direction substantially parallel to the epitaxial growth surface 101;

(S33) forming the N-type semiconductor layer 106, the active layer 107, and the P-type semiconductor layer 108 by growing continuously the epitaxial film 1044 along the direction substantially perpendicular to the epitaxial growth surface 101; and (S34) annealing the semiconductor epitaxial layer 104.

In step (S31), because the carbon nanotube layer 102 is placed on the epitaxial growth surface 101, the epitaxial crystal grains 1042 can only grow on the epitaxial growth surface 101 which are exposed out of the carbon nanotube layer 102 through the apertures 105. The growth direction of the epitaxial crystal grains 1042 is substantially perpendicular to the surface of the epitaxial growth surface 101.

In step (S32), the epitaxial crystal grains 1042 can grow out of the apertures 105 of the carbon nanotube layer 102 along the direction substantially parallel to the epitaxial growth surface 101. Thus the epitaxial crystal grains 1042 will form an integrated structure such as the epitaxial film 1044. During this process, a plurality of grooves 103 will be formed in the epitaxial film 1044. The carbon nanotubes are embedded in the grooves 103. If the carbon nanotube layer 102 is a single layer of carbon nanotube film or a plurality of carbon nanotube wires substantially parallel with each other, the grooves 103 are also substantially parallel with each other. If the carbon nanotube layer 102 includes a plurality of carbon nanotube films are stacked in a crossed order or a plurality of carbon nanotube wires intersect each other, the grooves 103 intersect each other to form a network structure. In one embodiment, the grooves 103 form a patterned N-type semiconductor layer 106 similar to that of the carbon nanotube layer 102. The distance between the two adjacent grooves 103 ranges from about 0.5 nanometers to about 100 micrometers, such as about, 1 nanometer, 10 nanometers, 50 nanometers, 1 micrometer, 10 nanometers, or 50 nanometers.

The carbon nanotubes of the carbon nanotube layer 102 can partly contact the N-type semiconductor layer 106 to electrically connect with the N-type semiconductor layer 106. The material of the N-type semiconductor layer can have good wettability with the carbon nanotubes, thus the carbon nanotube layer 102 will firmly contact the N-type semiconductor layer 106. Furthermore, the carbon nanotubes are coated with a layer of conductive material such as a doped SiC. Because the doped SiC has a good conductivity, the conductivity between the carbon nanotube layer 102 and the N-type semiconductor layer will be improved.

In step (S33), the dislocation between the epitaxial crystal grains 1042 and the substrate 100 will be reduced, and the quality of the epitaxial film 1044 will be improved, because of the carbon nanotube layer 102. The N-type semiconductor layer 106 homoepitaxially grows on the epitaxial film 1044, thus the N-type semiconductor layer 106 includes less defects. Furthermore, the quality of the active layer 107 and the P-type semiconductor layer 108 will also be improved.

The semiconductor epitaxial layer 104 can be doped by introducing the doped source gas. The material, doped element, and the doped ratio of the semiconductor epitaxial layer 104 can be selected by controlling the source gas. The thickness of the N-type semiconductor layer 106, the active layer 107, and the P-type semiconductor layer 108 can be selected separately by controlling the growth time. In one embodiment, the material of the semiconductor epitaxial layer 104 is GaN.

Furthermore, the method further includes a step of growing a layer of highly doped contact electrode (not shown). The highly doped contact electrode can be obtained by raising the doping ratio of the doped elements in the source gas. The N-type semiconductor layer 106, the active layer 107, the P-type semiconductor layer 108 and the contact electrode form the semiconductor epitaxial layer 104 together.

In step (S34), the doped elements in the semiconductor epitaxial layer 104 is activated in the annealing process. The annealing process is processed in a temperature range from about 700° C. to about 1100° C. under protective atmosphere for about 10 minutes to about 20 minutes.

In step (S40), the semiconductor epitaxial layer 104 can be etched by the following steps:

(S41) coating a layer of photo resist uniformly on the semiconductor epitaxial layer 104;

(S42) prebaking the photo resist in a temperature ranging from about 80° C. to about 100° C. for about 20 minutes to about 30 minutes;

(S43) exposing and developing the photo resist;

(S44) baking the photo resist in a temperature ranging from about 100° C. to about 150° C. for about 20 minutes to about 30 minutes;

(S45) corroding the semiconductor epitaxial layer 104 to form a predetermined figure; and (S46) removing the photo resist by immersing the photo resist into a solvent.

The step (S43) can further include the following substeps:

(S431) placing a mask layer on the surface of the semiconductor epitaxial layer 104;

(S442) irradiating the semiconductor epitaxial layer 104 using ultraviolet;

(S443) immersing the semiconductor epitaxial layer 104 into a developer for about 30 minutes to obtain a patterned photo resist.

A plurality of LEDs can be obtained by etching the semiconductor epitaxial layer 104 via the patterned photo resist.

In step (S50), the first electrode 110 and the second electrode 112 can be an N-type electrode or a P-type electrode. The thickness of the first electrode 110 and the second electrode 112 ranges from about 0.01 micrometers to about 2 micrometers. The first electrode 110 and the second electrode 112 can also function as a reflector. The material of the first electrode 110 and the second electrode 112 can be titanium (Ti), silver (Ag), aluminum (Al), nickel (Ni), gold (Au), or any combination of them. The material of the first electrode 110 and the second electrode 112 can also be indium-tin oxide (ITO) or carbon nanotube film. The first electrode 110 can cover the entire surface or a part of the surface of the P-type semiconductor layer 108. The first electrode 110 and the second electrode 112 can be made by an etching process with a mask layer.

Because the material of the first electrode 110 and the second electrode 112 is a metal or alloy, the material can be selected separately according to the semiconductor layer electrically connected with the first electrode 110. Thus the contact resistance will be reduced. The first electrode 110 and the second electrode 112 can be deposited via a process of physical vapor deposition, such as electron beam evaporation, vacuum evaporation, ion sputtering, or any physical deposition. While the light is extracted from the P-type semiconductor layer 108, the first electrode 110 should only cover a part of the surface of the P-type semiconductor layer 108. The ratio of the surface of the P-type semiconductor layer 108 which is covered by the first electrode ranges from about 10% to about 15%.

The second electrode 112 covers the entire surface of the carbon nanotube film 102. While the light is extracted from the substrate 100, the first electrode can cover the entire surface of the P-type semiconductor layer 108, and the second electrode 112 can cover the entire surface of the carbon nanotube film 102.

If the material of the first electrode 110 and the second electrode 112 is ITO, the first electrode 110 and the second electrode 112 can be deposited via magnetron sputtering, evaporation, spraying, or sol-gel method. The first electrode 110 can cover the entire surface of the P-type semiconductor layer 108, and the second electrode 112 can also cover the entire surface of the carbon nanotube layer 102.

The carbon nanotube layer 102 and the second electrode 112 should have a good electrical connection. Whether the carbon nanotube layer 102 includes a plurality of carbon nanotube layers stacked and intersecting each other, or a plurality of carbon nanotube wires intersecting each other, the carbon nanotubes in the entire carbon nanotube layer 102 are electrically connected with each other to form an integrated conductor. In one embodiment, the second electrode 112 is connected with an edge of the carbon nanotube layer 102 or four corners of the carbon nanotube layer 102. If the carbon nanotube layer 102 includes a single layer of carbon nanotube film or a plurality of carbon nanotube wires substantially parallel with each other, the carbon nanotubes in the carbon nanotube layer 102 are substantially oriented in the same direction. Because the conductivity between the two adjacent carbon nanotube wires parallel to each other is small, the second electrode 112 should be electrically connected to each of the carbon nanotube wires. In one embodiment, the extending direction of the second electrode 112 is substantially perpendicular to the extending direction of the carbon nanotubes.

Furthermore, a surface of the semiconductor epitaxial layer 104 can be roughened before step (S50). The surface of the semiconductor epitaxial layer 104 could be roughened by an etching process or irradiation with a laser to reduce the total reflection during the light extraction. The method of roughening the surface of the semiconductor epitaxial layer 104 can be processed according to the step (S31). A carbon nanotube layer is first placed on the semiconductor epitaxial layer 104. A layer of epitaxial crystal grains is then grown. The epitaxial crystal grains are discontinuous. The layer of epitaxial crystal grains defines as a patterned microstructure similar to that of the carbon nanotube layer 102. The microstructures can be a plurality of grooves substantially parallel or intersecting each other. The distance between two adjacent grooves ranges from about 0.5 nanometers to about 100 micrometers, such as about, 1 nanometer, 10 nanometers, 50 nanometers, 100 nanometers, 1 micrometer, 10 micrometer, or 50 nanometers. The carbon nanotube layer 102 can be used as the first electrode 110 or removed by heated in oxygen.

Different examples will be described in the following paragraphs.

Example 1

Figure 8:
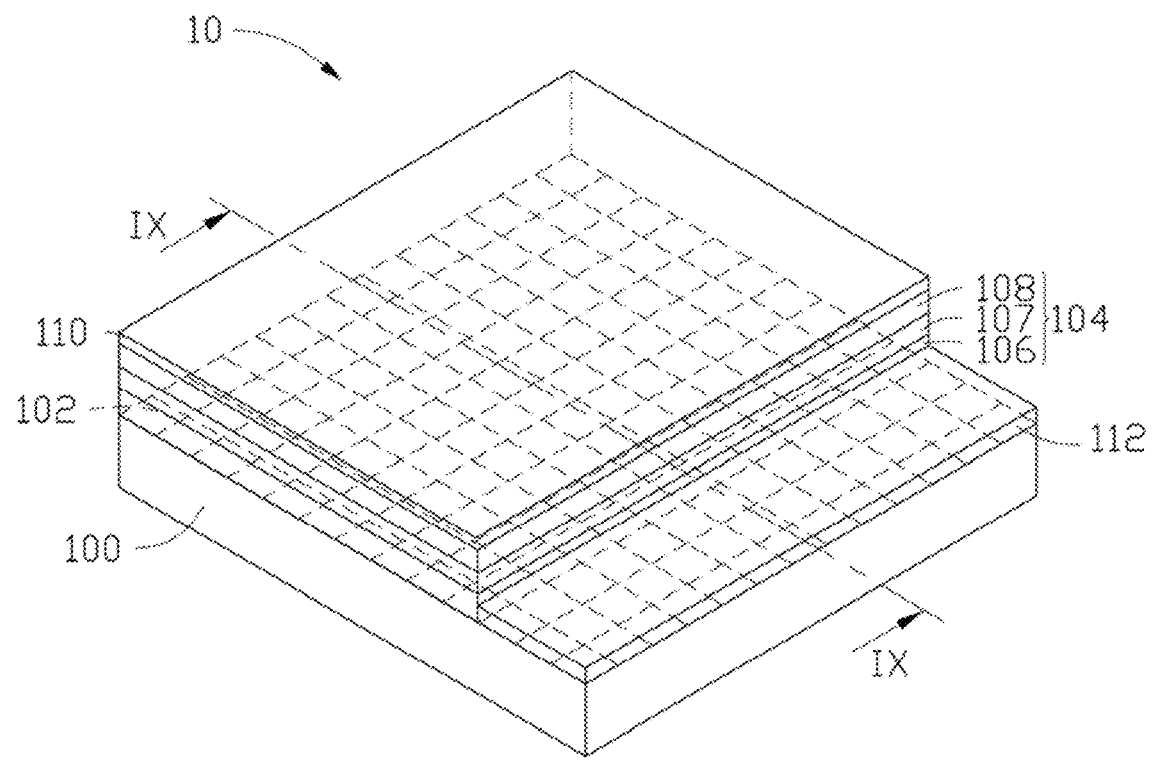
FIG. 8 shows a three-dimensional view of one embodiment of a LED fabricated according to the method of FIG. 1.
Figure 9:
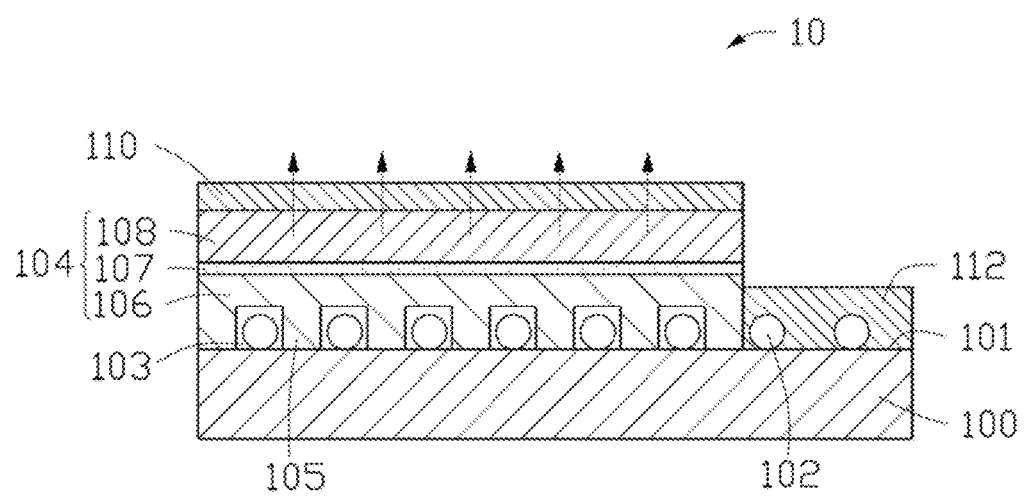
FIG. 9 is a schematic, cross-sectional view, along a line— of FIG. 8.

Referring to FIG. 8 and FIG. 9, a LED 10 includes a substrate 100, a carbon nanotube layer 102, a semiconductor epitaxial layer 104, a first electrode 110, and a second electrode 112. The semiconductor epitaxial layer 104 includes an N-type semiconductor layer 106, an active layer 107, and a P-type semiconductor layer 108.

The substrate 100 includes an epitaxial growth surface 101. The carbon nanotube layer 102 is placed on the epitaxial growth surface 101. The N-type semiconductor layer 106, the active layer 107 and the P-type semiconductor layer 108 are stacked on the same side of the epitaxial growth surface 101 in that order and cover a part of the carbon nanotube layer 102. The carbon nanotube layer 102 are partly sandwiched between the N-type semiconductor layer 106 and the substrate 100, and partly exposed from the semiconductor epitaxial layer 104. The second electrode 112 is electrically connected with the exposed part of the carbon nanotube layer 102. The location of the N-type semiconductor layer 106 and the P-type semiconductor layer 108 can be exchanged.

The carbon nanotube layer 102 is a continuous and integrated structure. The N-type semiconductor layer 106 is electrically connected with the carbon nanotube layer 102. The carbon nanotube layer 102 defines a plurality of apertures 105. The substrate 100 is partly exposed to the semiconductor epitaxial layer 104 from the apertures 105. The N-type semiconductor layer 106 penetrates the carbon nanotube layer 105 through the apertures 105 and connects with the substrate 100. Thus the N-type semiconductor layer 106 is placed on the substrate 100 through the apertures 105. The surface of the N-type semiconductor layer 106, which is connected with the substrate 100 includes a plurality of grooves 103. The plurality of grooves 103 are blind holes along the extending direction of the thickness of the semiconductor epitaxial layer 104. The carbon nanotubes of the carbon nanotube layer 102 are embedded in the grooves 103. The grooves 103 can be substantially parallel with each other or intersect each other to form a network structure. If the light excited from the active layer 107 reaches the interface between the N-type semiconductor layer 106 and the substrate 100 at a sufficiently large incident angle, the light will be scattered. The extracting direction of the light will be changed by the grooves 103 and the carbon nanotubes, thus the light can be extracted from the LED 10, and the light extraction efficiency will be improved.

The N-type semiconductor layer 106 is configured to provide electrons, and the P-type semiconductor layer 108 is configured to provide holes. The active layer 107 is configured to provide photons. The first electrode 110 and the second electrode 112 are configured to apply a voltage. The first electrode 110 is used as the upper electrode of the LED 10, and the second electrode 110 is used as the lower electrode. The carbon nanotube layer 102 is electrically connected to the entire surface of the N-type semiconductor layer 106. The first electrode 110 can cover the entire surface of the P-type semiconductor layer 108, and the second electrode 112 is electrically connected to the carbon nanotube layer 102. When applying a voltage between the first electrode 110 and the second electrode 112, the current flows from the upper electrode to the lower electrode. Thus the LED 10 forms in a vertical structure. The light can be extracted from the P-type semiconductor layer 108. If the first electrode 110 covers a part of the surface of the P-type semiconductor layer 108, the LED 10 forms in a horizontal structure. Because the carbon nanotube layer 102 covers the entire surface of the N-type semiconductor layer 106, the current flowing route in the LED 10 is shorter than the conventional LED, the energy consumption is reduced and the power can be improved.

In one embodiment, the material of the substrate 100 is sapphire ($Al_2O_3$). The carbon nanotube layer 102 includes two layers of carbon nanotube film stacked and intersecting each other. Each carbon nanotube film includes a plurality of carbon nanotubes oriented along a preferred orientation. An end of one carbon nanotube is joined to another end of an adjacent carbon nanotube arranged substantially along the same direction by the van der Waals force. In one embodiment, the preferred orientation of the carbon nanotubes in one carbon nanotube layer is substantially perpendicular to another carbon nanotube layer thereof. The apertures 105 are formed between the adjacent carbon nanotubes in the direction substantially perpendicular to the preferred orientation. The N-type semiconductor layer 106 is GaN doped with Si, and the thickness ranges from about 1 micrometer to about 5 micrometers. The active layer 107 is multilayer quantum well films which include one layer of GaInN and another layer of GaN. The thickness of the active layer 107 ranges from about 0.01 micrometers to about 0.6 micrometers. The P-type semiconductor layer 108 is GaN doped with Mg, and the thickness ranges from about 0.1 micrometers to about 3 micrometers. The first electrode 110 is an ITO transparent electrode in a thickness of about 50 nanometers. The first electrode 110 covers the entire surface of the P-type semiconductor layer 108. The second electrode 112 is an N-type electrode placed on the exposed surface of the carbon nanotube layer 102. The second electrode 112 includes one layer of Ti in a thickness of about 150 angstroms and another layer of Au in a thickness of about 2000 angstroms.

In one embodiment, the semiconductor epitaxial layer 104 is made by the MOCVD method. In the MOCVD method, the nitrogen source gas is high-purity ammonia ($NH_3$), the carrier gas is hydrogen ($H_2$), the Ga source gas is trimethyl gallium (TMGa) or triethyl gallium (TEGa), and the Si source gas is silane ($SiH_4$). The growth of the semiconductor epitaxial layer 104 can include the following steps:

(a) placing the substrate 100 into a furnace and heating the substrate 100 to about 1100° C. to about 1200° C., introducing the carrier gas, and baking the substrate 100 for about 200 seconds to about 1000 seconds;

(b) introducing the Ga source gas and the nitrogen source gas at the same time and cooling down the temperature to a range from about 500° C. to 650° C. and keeping the pressure range from 500 torr to about 600 torr in the carrier gas atmosphere to grow a low-temperature GaN buffer layer, and the thickness of the buffer layer ranges from about 10 nanometers to about 50 nanometers;

(c) stopping the flow of the Ga source gas in the carrier gas and nitrogen source gas atmosphere, increasing the temperature to a range from about 1100° C. to about 1200° C., and maintaining for about 30 seconds to about 300 seconds to anneal the substrate 100;

(d) maintaining the temperature at a range from about 1000° C. to about 1100° C. and the pressure range from about 100 torr to about 300 torr, and reintroducing the Ga source gas and introducing the Si source gas to grow the high quality GaN layer doped with Si;

(e) stopping the flow of the Si source gas and maintaining the temperature of the reaction furnace to a range from about 700° C. to about 900° C., and the pressure of the reaction furnace to a range from about 50 torrs to about 500 torrs, and introducing the indium source gas simultaneously to grow InGaN/GaN multilayer quantum well film, wherein the thickness of the InGaN ranges from about 2 nanometers to about 5 nanometers, and the thickness of the GaN ranges from about 5 nanometers to about 20 nanometers;

(f) stopping the flow of the indium source gas and maintaining the temperature of the reaction furnace at a range from about 1000° C. to about 1100° C., and the pressure of the reaction furnace at a range from about 76 torrs to about 200 torrs; and introducing the Mg source gas at the same time to grow P-type GaN layer doped with Mg;

(g) stopping the flow of the source gas and annealing the substrate 100 in a temperature ranging from about 700° C. to about 800° C. in $N_2$ atmosphere for about 10 minutes to about 20 minutes;

(h) etching the GaN epitaxial layer to expose part of the surface of the carbon nanotube layer 102;

(i) depositing an ITO layer having a thickness of about 50 nanometers on the surface of the P-type GaN layer;

(j) depositing a Ni layer and an Au layer on the exposed part of the carbon nanotube layer 102, in which the thickness of the Ni layer is about 150 angstroms and the Au is about 2000 angstroms.

Furthermore, a layer of P-type AlGaN doped with Mg can be grown before step (f). The temperature of the furnace is maintained at about 1000° C. to about 1100° C., and the pressure of the furnace is maintained at about 76 torr to about 200 torr. The trimethyl Aluminum is introduced into the furnace to grow the AlGaN with a thickness ranging from about 30 nanometers to about 50 nanometers.

Figure 10:
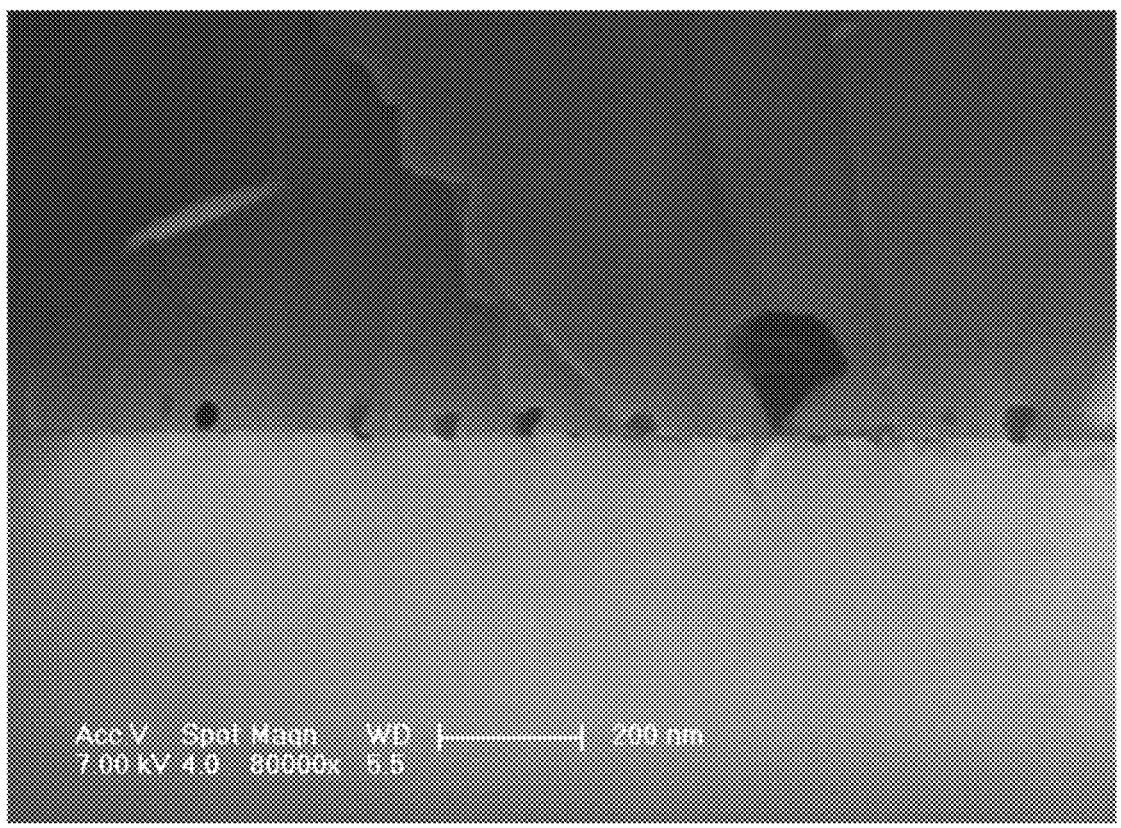
FIG. 10 shows a SEM of a cross-section of the junction between the semiconductor epitaxial layer and the substrate.
Figure 11:
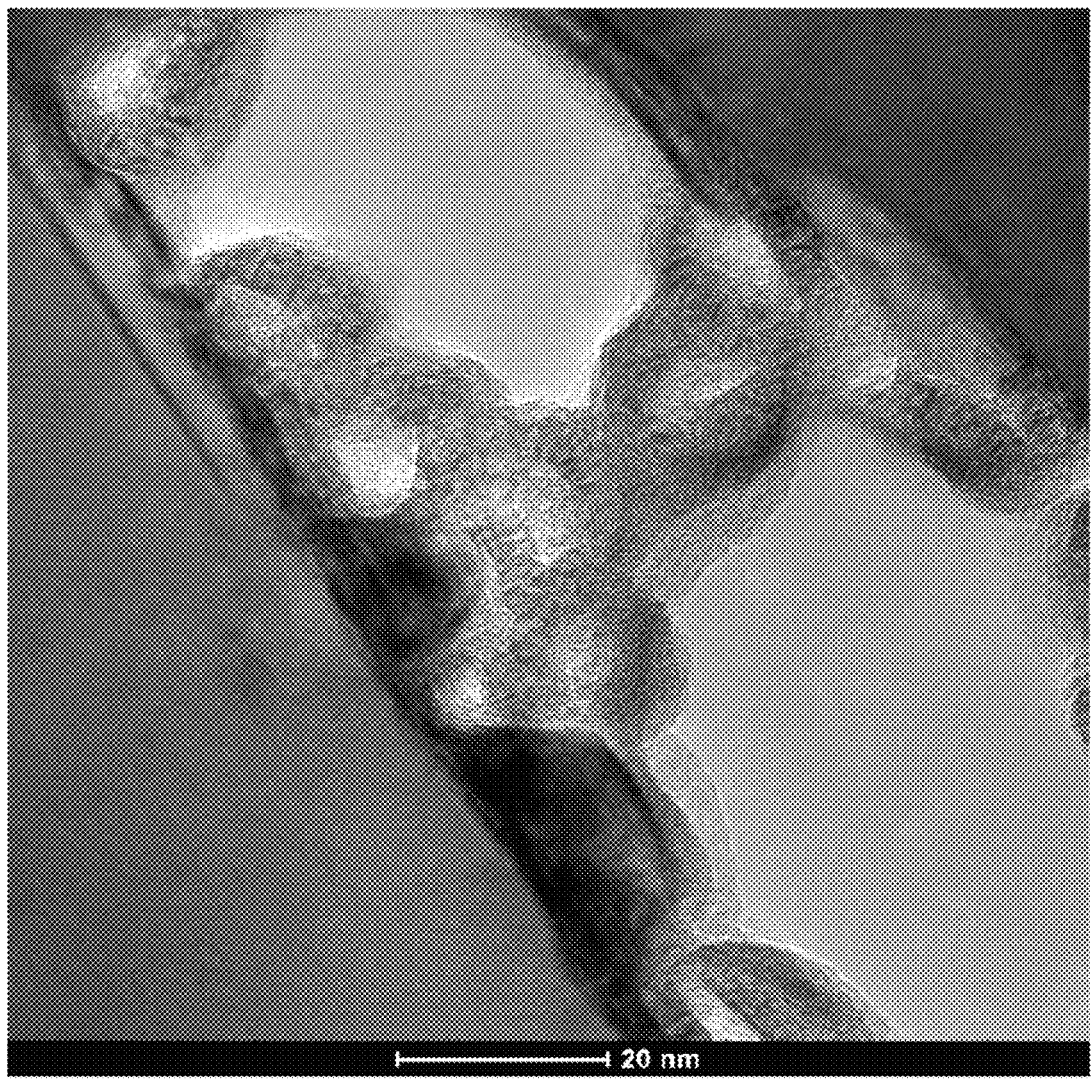
FIG. 11 show a Transmission Electron Microscopy (TEM) image of magnified part of FIG. 10

After the step (g), the sample is scanned by the SEM and the TEM. Referring to FIG. 10 and FIG. 11, the N-type semiconductor layer can only grow on the substrate not covered by the carbon nanotubes. A plurality of holes is formed between the N-type semiconductor layer and the substrate. FIG. 10 shows the cross-section of the junction between the N-type semiconductor layer and the sapphire substrate. The dark portion is the N-type semiconductor layer, and the lighter portion is the sapphire substrate. Referring to FIG. 11, the carbon nanotubes exist in each hole, and the carbon nanotubes are attached on the substrate and contacted with the N-type semiconductor layer.

Embodiment 2

Figure 12:
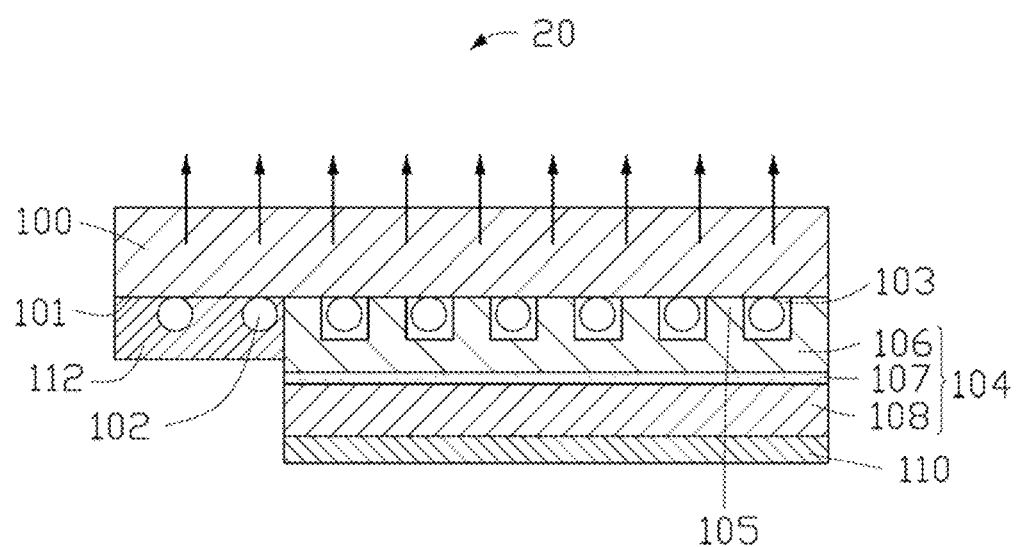
FIG. 12 is a cross-section view of one embodiment of a LED.

Referring to FIG. 12, a LED 20 includes a substrate 100, a carbon nanotube layer 102, a semiconductor epitaxial layer 104, a first electrode 110, and a second electrode 112. The semiconductor epitaxial layer 104 includes an N-type semiconductor layer 106, an active layer 107, and a P-type semiconductor layer 108. The LED 20 is similar to the LED 10 except that the first electrode 110 is configured as the reflector. The first electrode 110 covers the entire surface of the P-type semiconductor layer 108. While the LED is working, the light is extracted from the sapphire substrate.

The first electrode 110 includes a super smooth and plane surface to improve the reflection efficiency. In one embodiment, the first electrode 110 is a metallic reflector film. The material of the first electrode 110 can be selected from Ti, Ag, Al, Ni, Au or any alloy of them such as Au/AuBe or Au/Cu/Al. The thickness of the first electrode 110 can be selected according to need. In one embodiment, the first electrode 110 ranges from about 50 nanometers to about 250 nanometers in thickness, wherein the Ni ranges from about 10 nanometers to about 50 nanometers in thickness, the Cu ranges from about 20 nanometers to about 50 nanometers in thickness and the Al ranges from about 30 nanometers to about 150 nanometers. In another embodiment, the first electrode 110 is a multilayer structure composed of Ni/Cu/Al. The Al layer is attached on the surface of P-type semiconductor layer 108. The thickness of the first electrode is about 140 nanometers wherein the Ni is about 20 nanometers, the Cu is about 20 nanometers and the Al is about 100 nanometers in thickness. When the photons from the active layer 107 reach the first electrode 110, the photons will be reflected. The first electrode 10 can also be a metallic plate with high conductivity. The metallic plate can function as the reflector, the heat sink, and the electrode.

The LED is sealed into a flip chip structure, and the surface of the sapphire is used as the light extraction surface. Because the first electrode 110 reflects all the photons incidental to the P-type semiconductor layer 108, the light will be extracted from the sapphire, and the light extraction efficiency of the LED will be improved.

It is understood that, if the light excited from the active layer 107 reaches the interface between the N-type semiconductor layer 106 and the substrate 100 at a sufficiently large incident angle, the light will be scattered. The extracting direction of the light will be changed by the grooves 103 and the carbon nanotubes, thus the light can be extracted from the LED 10, and the light extraction efficiency will be improved. Furthermore, a heat sink can be applied on the first electrode to extract the heat.

The method for making the LED 20 is similar to the method for making the LED 10.

Embodiment 3

Figure 13:
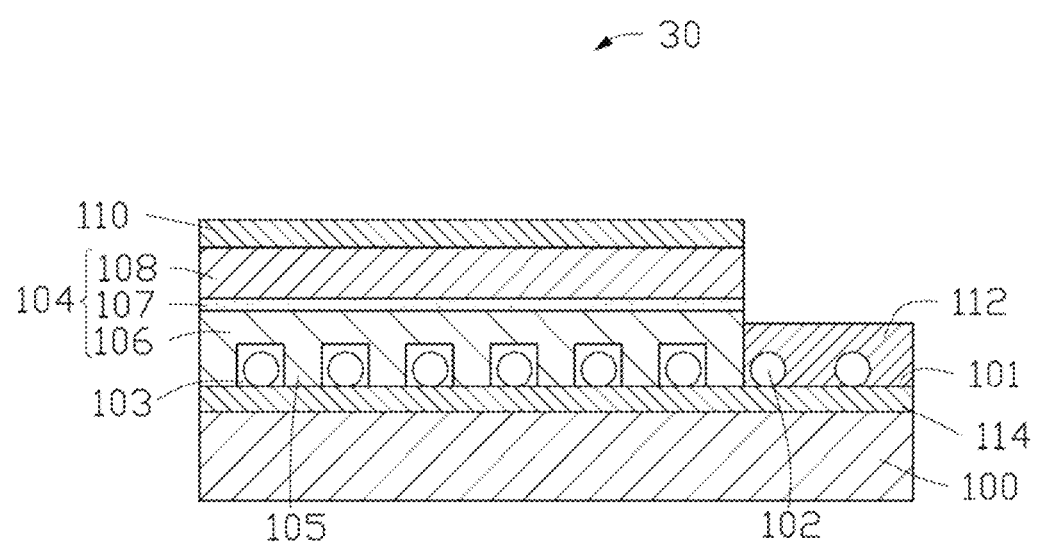
FIG. 13 is a cross-section view of another embodiment of a LED.

Referring to FIG. 13, an LED 30 includes a substrate 100, a carbon nanotube layer 102, a semiconductor epitaxial layer 104, a first electrode 110, and a second electrode 112. The semiconductor epitaxial layer 104 includes an N-type semiconductor layer 106, an active layer 107, and a P-type semiconductor layer 108. The LED 30 is similar to the LED 10 except that an intrinsic semiconductor layer 114 is sandwiched between the N-type semiconductor layer 106 and the substrate 100. The carbon nanotube layer 102 is sandwiched between the N-type semiconductor layer 106 and the intrinsic semiconductor layer 114.

The method for making the LED 30 is similar to the LED 10 except that a buffer layer (not shown) and the intrinsic semiconductor layer 114 are grown on the epitaxial growth surface 101. The carbon nanotube layer 102 is placed on the intrinsic semiconductor layer 114, and the N-type semiconductor layer 106, the active layer 107, and the P-type semiconductor layer 108 are grown on the intrinsic semiconductor layer 114 in that order.

Embodiment 4

Figure 14:
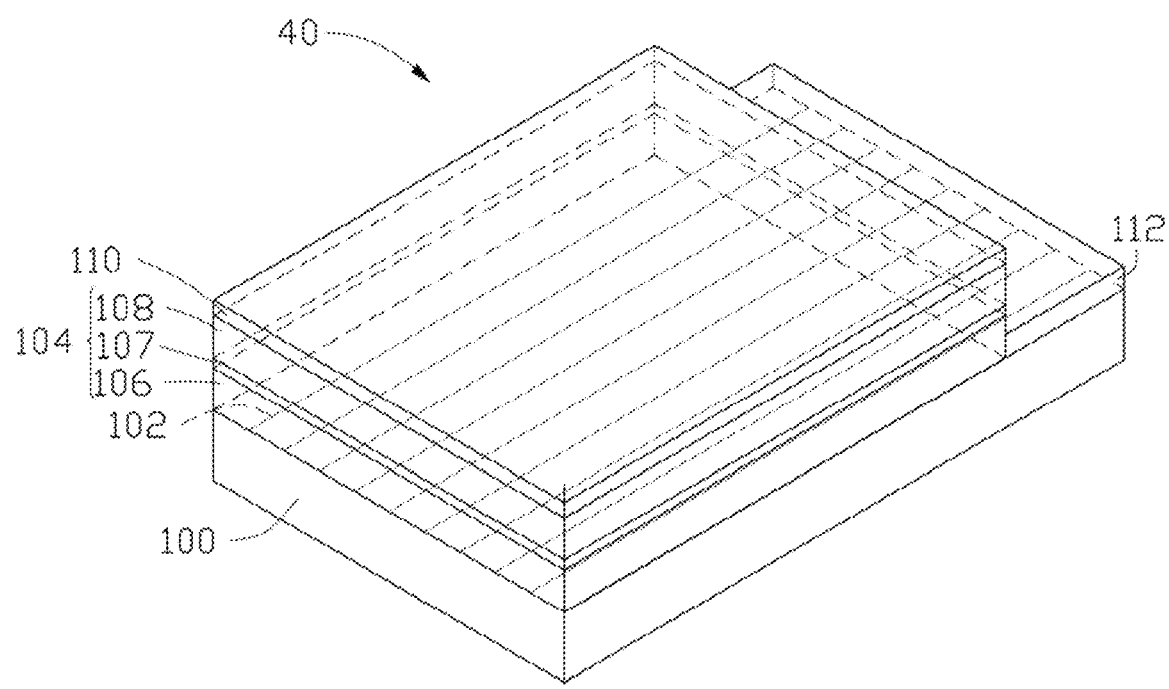
FIG. 14 is a three-dimensional view of one embodiment of a LED.

Referring to FIG. 14, an LED 40 in one embodiment includes a substrate 100, a carbon nanotube layer 102, a semiconductor epitaxial layer 104, a first electrode 110, and a second electrode 112. The semiconductor epitaxial layer 104 includes an N-type semiconductor layer 106, an active layer 107 and a P-type semiconductor layer 108. The LED 40 is similar to the LED 10 except that the carbon nanotube layer 110 includes a plurality of carbon nanotube wires. The plurality of carbon nanotube wires is substantially parallel and spaced with each other. The apertures 105 are formed between the two adjacent carbon nanotube wires.

The carbon nanotube wires can be untwisted carbon nanotube wires or twisted carbon nanotube wires. The untwisted carbon nanotube wires include a plurality of carbon nanotubes extending along the extend direction of the carbon nanotube wires. The twisted carbon nanotube wires include a plurality of carbon nanotubes spinning and extending around the axis of the carbon nanotube wires.

In the method for making the LED 40, the semiconductor epitaxial layer 104 is etched along the direction substantially perpendicular to the extending direction of the carbon nanotube wires. A portion of each carbon nanotube wires is exposed. The exposed portion of the carbon nanotube wire is electrically connected to the second electrode 112, thus the carbon nanotube layer 102 forms an integrated conductive structure. The second electrode 112 forms a strip-like structure. The extending direction of the second electrode 112 is substantially perpendicular to the extending direction of the carbon nanotube wires.

Embodiment 5

Figure 15:
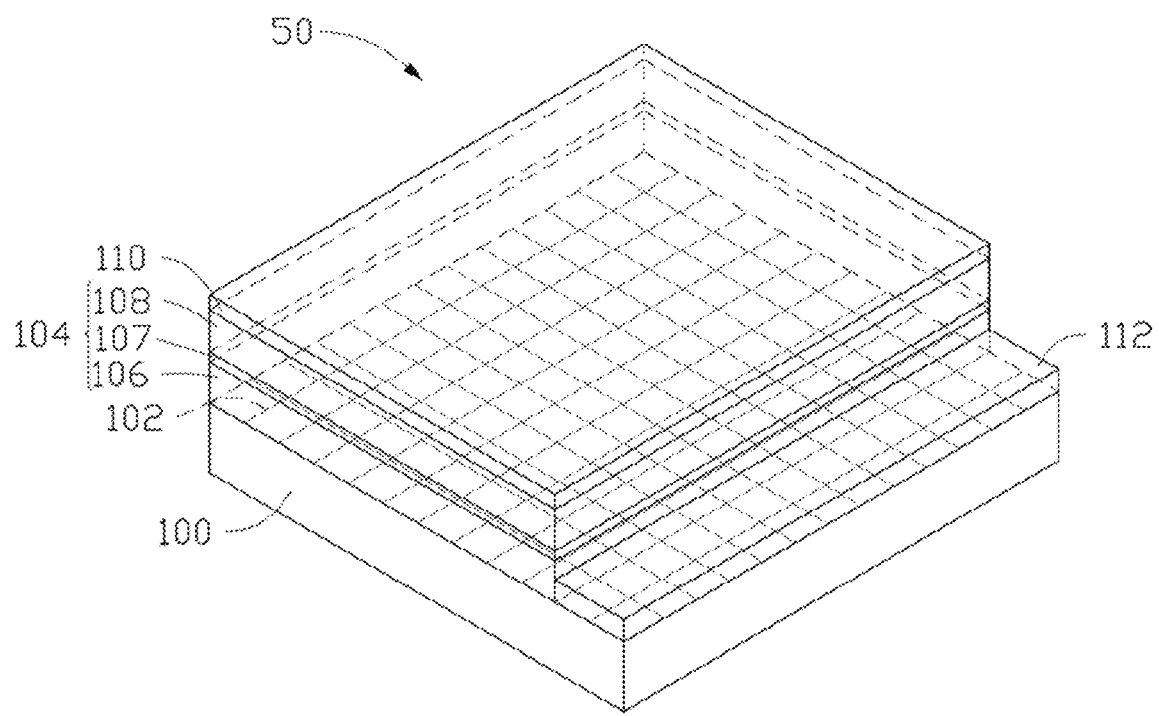
FIG. 15 is a three-dimensional view of another embodiment of a LED.

Referring to FIG. 15, an LED 50 in one embodiment includes a substrate 100, a carbon nanotube layer 102, a semiconductor epitaxial layer 104, a first electrode 110, and a second electrode 112. The semiconductor epitaxial layer 104 includes an N-type semiconductor layer 106, an active layer 107 and a P-type semiconductor layer 108. The LED 50 is similar to the LED 10 except that the carbon nanotube layer 110 includes a plurality of carbon nanotube wires. The plurality of carbon nanotube wires is spaced and intersecting each other. Each aperture is defined by four adjacent and intersecting carbon nanotube wires.

Some carbon nanotube wires extend along a first direction and some carbon nanotube wires extend along a second direction. The first direction and the second direction intersect each other. A portion of the carbon nanotube wires extending along the first direction is exposed, and the exposed portion of the carbon nanotube wires is electrically connected to the second electrode 112. In one embodiment, the first direction is substantially perpendicular to the second direction. The first direction and the second direction intersect at arbitrary angles, to ensure the carbon nanotube layer 102 includes a plurality of apertures 105 to expose a portion of the substrate 100.

The method for making the LED has many advantages. One, the carbon nanotube layer is a continuous and freestanding structure, and it can be directly placed on the substrate to grow an epitaxial layer. The process is simple and the complex sputtering process is avoided. A plurality of microstructures can also be formed on the light extraction surface of the LED using carbon nanotube layers as the mask layer, thereby avoiding any complex etching process. Another is the apertures in the carbon nanotube layer and the microstructures are sufficiently small such that the light extraction efficiency is improved. Yet another is because the etching process is avoided, damage to the lattice structure of the LED will be reduced.

Depending on the embodiment, certain of the steps of methods described may be removed, others may be added, and the sequence of steps may be altered. The description and the claims drawn to a method may include some indication in reference to certain steps. However, the indication used is only to be viewed for identification purposes and not as a suggestion as to an order for the steps.

The above-described embodiments are intended to illustrate rather than limit the disclosure. Variations may be made to the embodiments without departing from the spirit of the disclosure as claimed. Any element of any one embodiment is considered to be disclosed to be incorporated with any other embodiment. The above-described embodiments illustrate the scope of the disclosure but do not restrict the scope of the disclosure.

What is claimed is:

1. A light emitting diode, comprising:
a substrate comprising an epitaxial growth surface;
a semiconductor epitaxial layer comprising a second semiconductor layer, an active layer, and a first semiconductor layer stacked on the substrate in sequence, wherein a first part of the epitaxial growth surface is covered by the first semiconductor layer, and a second part of the epitaxial growth surface is exposed;
a first electrode electrically connected with the second semiconductor layer;
a second electrode electrically connected with first semiconductor layer; and
a patterned carbon nanotube layer fixed between the first semiconductor layer and the substrate, wherein the patterned carbon nanotube layer is a continuous and integrated structure, the patterned carbon nanotube layer comprises a first portion sandwiched between the first semiconductor layer and the substrate, and a second portion covers the second part of the epitaxial growth surface, and the second electrode covers the second portion of the patterned carbon nanotubes layer.

2. The light emitting diode of claim 1, wherein the patterned carbon nanotube layer defines a plurality of apertures and the first semiconductor layer contacts the epitaxial growth surface through the plurality of apertures.

3. The light emitting diode of claim 1, wherein the first semiconductor layer is a patterned semiconductor layer which defines a plurality of grooves on a surface connected to the epitaxial growth surface.

4. The light emitting diode of claim 3, wherein the patterned carbon nanotube layer is embedded in the plurality of grooves.

5. The light emitting diode of claim 3, wherein the plurality of grooves are substantially parallel with each other or intersected with each other.

6. The light emitting diode of claim 1, wherein the patterned carbon nanotube layer comprises a plurality of carbon nanotubes extending substantially parallel with a surface of the patterned carbon nanotube layer.

7. The light emitting diode of claim 6, wherein the plurality of carbon nanotubes extend substantially parallel with the epitaxial growth surface.

8. The light emitting diode of claim 6, wherein the plurality of carbon nanotubes are oriented substantially along the same direction and joined end to end by van der Waals force.

9. The light emitting diode of claim 1, wherein the patterned carbon nanotube layer comprises a plurality of carbon nanotube films stacked together.

10. The light emitting diode of claim 1, wherein the patterned carbon nanotube layer comprises a plurality of carbon nanotube wires substantially parallel with each other.

11. The light emitting diode of claim 1, wherein the patterned carbon nanotube layer comprises a plurality of carbon nanotube wires, some of the carbon nanotube wires extend along a first direction and the rest of the carbon nanotube wires extend along a second direction, the first direction and the second direction intersect with each other.

12. The light emitting diode of claim 2, wherein a size of each of the plurality of apertures ranges from about 20 nanometers to about 500 nanometers.

13. The light emitting diode of claim 1, wherein the first electrode covers the entire surface of the second semiconductor layer, and the second electrode covers the entire surface of the second portion of the patterned carbon nanotube layer.

14. The light emitting diode of claim 13, wherein the second electrode is in direct contact with the second portion of the patterned carbon nanotube layer.

15. The light emitting diode of claim 1, wherein the second semiconductor layer defines a plurality of grooves substantially parallel to or intersecting with each other on a surface away from the substrate.

16. The light emitting diode of claim 1, further comprising an intrinsic semiconductor layer sandwiched between the first semiconductor layer and the substrate, wherein the patterned carbon nanotube layer is sandwiched between the first semiconductor layer and the intrinsic semiconductor layer.

17. The light emitting diode of claim 1, wherein the patterned carbon nanotube layer comprises a plurality of carbon nanotubes and a doped silicon carbide conductive layer coated on the plurality of carbon nanotubes.

\* \* \* \* \*

UNITED STATES PATENT AND TRADEMARK OFFICE
CERTIFICATE OF CORRECTION

PATENT NO. : 9,012,946 B2  
APPLICATION NO. : 14/449104  
DATED : April 21, 2015  
INVENTOR(S) : Yang Wei and Shou-Shan Fan Page 1 of 1

It is certified that error appears in the above-identified patent and that said Letters Patent is hereby corrected as shown below:

TITLE PAGE

Please replace item (30) regarding "Foreign Application Priority Data" with the following:

(30)      Foreign Application Priority Data

Apr. 29, 2011 (CN) .................. 2011 1 0107515

Signed and Sealed this
Twelfth Day of July, 2016

Michelle K. Lee
*Director of the United States Patent and Trademark Office*